United States Patent [19]
Woo

[11] Patent Number: 5,220,216
[45] Date of Patent: Jun. 15, 1993

[54] PROGRAMMABLE DRIVING POWER OF A CMOS GATE

[76] Inventor: Ann K. Woo, 22997 Standing Oak Ct., Cupertino, Calif. 95014

[21] Appl. No.: 816,683

[22] Filed: Jan. 2, 1992

[51] Int. Cl.[5] .................... H03K 19/094; H03K 19/20
[52] U.S. Cl. .................................... 307/469; 307/451; 307/594; 307/602
[58] Field of Search ............... 307/465, 468, 469, 594, 307/602, 605, 606, 451

[56] References Cited

U.S. PATENT DOCUMENTS

| | | | |
|---|---|---|---|
| 4,593,203 | 6/1986 | Iwahashi | 307/469 |
| 4,719,369 | 1/1988 | Asano et al. | 307/451 |
| 4,806,804 | 2/1989 | O'Leary | 307/469 |
| 4,899,071 | 2/1990 | Morales | 307/602 |
| 5,012,141 | 4/1991 | Tomisawa | 307/594 |
| 5,118,971 | 6/1992 | Schenck | 307/468 |

Primary Examiner—Edward P. Westin
Assistant Examiner—Andrew Sanders

[57] ABSTRACT

A CMOS gate is provided which has a programmable driving power characteristic so that its propagation delay time can be varied by digital select control signals (S1–Sm). The CMOS gate includes a programmable inverter section (12) formed of a plurality of inverters (12a–12m), a switching logic control section (14), and a static inverter (16). The switching logic control signal section is responsive to the digital select control signals for selectively programming a certain number of the plurality of inverters to be enabled. In this manner, a certain number of the plurality of inverters will be wired in parallel with the static inverter in order to produce the desired amount of propagation delay time.

14 Claims, 1 Drawing Sheet

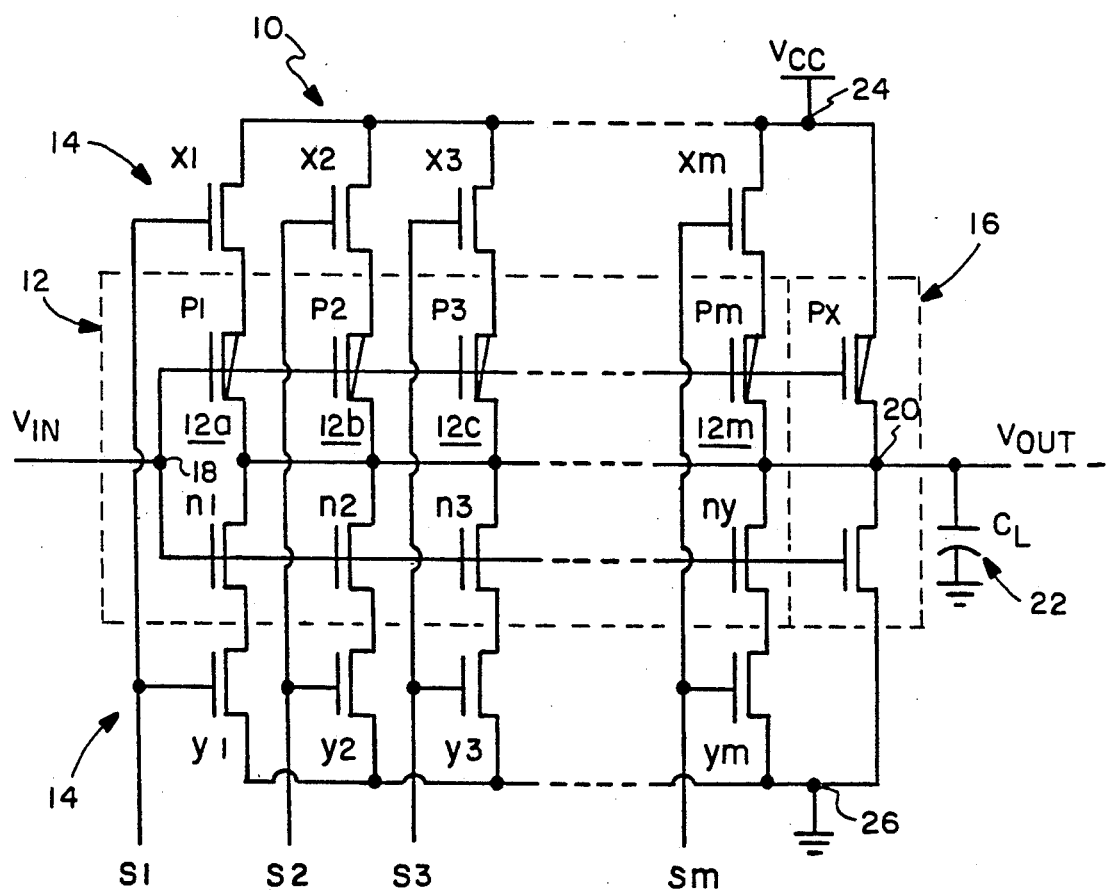

PROGRAMMABLE DRIVING POWER OF A CMOS GATE

BACKGROUND OF THE INVENTION

This invention relates generally to electrical time delay circuits and more particularly, it relates to a CMOS gate having a programmable driving power characteristic so that its propagation delay time can be varied by digitally selected control signals.

Heretofore, there are known in the prior art conventional delay line circuits formed of inductances, capacitances and resistances to control the desired time delay. Further, there also exists prior art delay line circuits of the type which utilize electronic circuitry such as inverters and logic circuits so as to control the time delay. However, such conventional delay lines generally do not have the capability of being programmable so as to allow the user to vary or change the amount of time delay.

As is generally know, a conventional CMOS inverter may be used to form a delay element and is comprised of a P-channel MOS transistor and an N-channel MOS transistor. The gates of the P-channel and N-channel transistors are connected together so as to define the input of the inverter, and the drains thereof are connected together so as to define the output of the inverter. The source of the P-channel transistor is connected to a power supply voltage or potential VDD, and the source of the N-channel transistor is connected to a ground potential VSS. When an input having a predetermined waveform is applied to the input of the inverter, an output signal appearing at the output of the inverter is delayed.

This propagation delay of the CMOS inverter gate is normally dependent upon the ratio of its driving capability to the loading connected to its output. For example, when the load is capacitive the delay is due to the charging and discharging of the capacitor. Thus, if the driving power of the CMOS inverter gate is high, the propagation delay will be small. On the other hand, if the driving power of the CMOS inverter gate is small, the propagation delay will be large.

It would therefore be desirable to provide a CMOS gate whose propagation delay time is capable of being easily programmable by users. Further, it would be expedient to have the amount of time delay being varied or controlled by digitally selected control signals. The present invention may be implemented in a variety of circuit applications. Such applications include, but are not limited to, programmable delay lines and ring oscillators.

SUMMARY OF THE INVENTION

Accordingly, it is a general object of the present invention to provide a CMOS gate having a programmable driving power characteristic which is relatively simple and economical to manufacture and assemble.

It is an object of the present invention to provide a CMOS gate having a programmable driving power characteristic so that its propagation delay time can be varied by digitally selected control signals.

It is another object of the present invention to provide a CMOS gate having a programmable driving power which includes a programmable inverter circuit section, a switching logic control section, and a static inverter.

It is still another object of the present invention to provide a CMOS gate having a programmable driving power which includes a programmable inverter circuit section formed of a plurality of inverters and a switching logic control section responsive to digital select control signals for selectively programming a certain number of the plurality of inverters to be enabled, thereby establishing the desired amount of propagation delay time.

In accordance with these aims and objectives, the present invention is concerned with the provision of a CMOS gate having a programmable driving power characteristic which includes a plurality of parallel-connected inverters, a plurality of upper switching transistors, and a plurality of lower switching transistors. The plurality of parallel-connected inverters have their inputs connected to an input node for receiving an input logic signal and their outputs connected to an output node for generating an output logic signal. Each of the plurality of inverters is formed of a P-channel transistor and an N-channel transistor.

The plurality of upper switching transistors have their conduction paths connected between a power supply potential and a respective source electrode of the P-channel transistors of the plurality of inverters. The plurality of lower switching transistors have their conduction paths connected between a ground potential and a respective source electrode of the N-channel transistors of the plurality of inverters.

The gate electrodes of the plurality of lower switching transistors are connected to a corresponding one of the gate electrodes of the plurality of upper switching transistors and are connected to receive a corresponding one of digital select control signals. Each of the digital select control signals are either at a high or low logic level for selectively programming certain ones of the upper and lower switching transistors to be turned on so as to enable selected ones of the plurality of inverters for varying the driving power characteristic. The output logic signal has a propagation delay relative to the input logic signal which is dependent upon the driving power characteristic.

BRIEF DESCRIPTION OF THE DRAWING

These and other objects and advantages of the present invention will become more fully apparent from the following detailed description when read in conjunction with the accompanying drawing in which there is shown a schematic circuit diagram of a CMOS gate having a programmable driving power characteristic of the instant invention.

DESCRIPTION OF THE PREFERRED EMBODIMENT

Referring now in detail to the drawing of the particular illustration, there is shown a schematic circuit diagram of a CMOS gate 10 having a programmable driving power characteristic which is constructed in accordance with the principles of the present invention. The CMOS gate 10 is comprised of a programmable inverter circuit section 12, a switching logic control section 14, and a static inverter 16.

The inverter circuit section 12 has an input node 18 and an output node 20. The input node is connected to receive an input logic signal $V_{in}$ having a particular waveform. The output node 20 is connected to a load 22 which is represented by a capacitor $C_L$. One end of the capacitor is connected to the output node 20, and the other end of the capacitor is connected to a ground potential. An output logic signal $V_{out}$ appearing at the output node 20 is inverted and delayed with respect to the input logic signal $V_{in}$. The amount of propagation delay from the input node to the output node can be varied by programming the driving power of the CMOS gate 10 through digitally selected control signals, as will be more fully described hereinafter.

The programmable inverter circuit section 12 includes a plurality of parallel-connected CMOS inverters 12a, 12b, 12c, . . . 12m each being formed of a P-channel MOS transistor and an N-channel MOS transistor. For example, the inverter 12a includes a P-channel MOS transistor p1 and an N-channel MOS transistor n1 whose gates are connected together to form its input and whose drains are connected together to form its output. The inverter 12b includes a P-channel MOS transistor p2 and an N-channel MOS transistor n2 whose gates are connected together to form its input and whose drains are connected together to form its output. Further, the inverter 12c includes a P-channel MOS transistor p3 and an N-channel transistor n3 whose gates are connected together to form its input and whose drains are connected together to form its output. Finally, the inverter 12m includes a P-channel MOS transistor pm and an N-channel MOS transistor nm whose gates are connected together to form its input and whose drains are connected together to form its output.

It will be noted that the inputs of each of the inverters 12a, 12b, . . . 12m are connected together and to the input node 18 for receiving the input logic signal $V_{in}$. The outputs of each of the inverters 12a-12m are connected together and to the output node 20 for generating the output logic signal $V_{out}$. The inverter circuit section 12 has a variable propagation delay which is dependent upon the driving power characteristic that is presented to the output node 20. This driving power characteristic can be varied or changed by selectively programming a certain number of the plurality of inverters 12a-12m to be enabled in order to obtain a desired amount of propagation delay time.

The switching logic control section 14 is comprised of a plurality of first switching transistors x1, x2, x3, . . . xm. The conduction path of each of the upper switching transistors is connected between a power supply potential or voltage VCC at node 24 and a respective one of the P-channel transistors of the inverter circuit section 12. In particular, the switching transistor x1 has its drain electrode connected to the power supply potential VCC and its source electrode connected to the source electrode of the P-channel transistor p1. The switching transistor x2 has its drain electrode connected also to the power supply potential and its source electrode connected to the source electrode of the P-channel transistor p2. The switching transistor x3 has its drain electrode connected also to the power supply potential and its source electrode connected to the source electrode of the P-channel transistor p3. Finally, the switching transistor xm has its drain electrode connected also to the power supply potential and its source electrode connected to the source electrode of the P-channel transistor pm.

Further, the switching logic control section 14 is also comprised of a plurality of lower switching transistors y1, y2, y3, . . . ym. The conduction path of each of the lower switching transistors is connected between a respective one of the N-channel transistors of the inverter circuit section 12 and the ground potential at node 26. In particular, the switching transistor y1 has its drain electrode connected to the source electrode of the N-channel transistor n1 and its source electrode connected to the ground potential. The switching transistor y2 has its drain electrode connected to the source electrode of the N-channel transistor n2 and its source electrode connected also to the ground potential. The switching transistor y3 has its drain electrode connected to the source electrode of the N-channel transistor n3 and its source electrode connected also to the ground potential. Finally, the switching transistor ym has its drain electrode connected to the source electrode of the N-channel transistor nm and its source electrode connected also to the ground potential.

The gates of each of the lower switching transistors y1-ym are connected to a corresponding one of the gates of the upper switching transistors x1-xm and are connected to receive a respective one of digital select control signals S1-Sm. In other words, the gate of the lower gating transistor Y1 is connected to the gate of the upper gating transistor x1 and receives the digital select control signal S1. Similarly, the gate of the lower gating transistor y2 is connected to the gate of the upper gating transistor x2 and receives the digital select control signal S2, and so on.

Each of the digital select control signals S1-Sm may be either at a high or low logic level for selectively programming a certain number of the plurality of inverters 12a-12m to be enabled. Specifically, when only the digital select signal S1 is at a high logic level only the upper and lower switching transistors x1 and y1 will be turned on so as to enable the inverter 12a. When only the digital select signals S1 and S2 are at the high logic level, the upper and lower switching transistors x1, x2 and y1, y2 will be rendered conductive so as to enable both the inverters 12a and 12b, and so on.

In this manner, each individual one of the plurality of inverters 12a-12m can be selectively enabled one at a time so as to logically wire them in parallel. It should be apparent to those skilled in the art that as the number of enabled inverters increased there is created effectively a larger and larger inverter circuit section 12 which has an increased driving power characteristic. As a result, the propagation delay between the output logic signal and the input logic signal will become smaller and smaller.

The static inverter 16 is comprised of a P-channel MOS transistor px and an N-channel MOS transistor ny. The gates of the transistors px and ny are connected together to define the input of the static inverter. The drains of the transistors px and ny are connected together to define the output of the static inverter. The source electrode of the P-channel transistor px is connected directly to the power supply potential VCC, and the source electrode of the N-channel transistor ny is connected directly to the ground potential. Thus, the static inverter 16 is always enabled. Consequently, when all of the digital select control signals S1-Sm are at the low logic level, the propagation delay of the CMOS gate 10 will be determined only by the driving power characteristic of the static inverter 16.

While the upper and lower gating transistors x1-xm and y1-ym are shown as N-channel transistors, it should be clear that this invention could be implemented by replacing the N-channel transistors with P-channel transistors or by using other types of transistors. Further, in the alternative all of the upper gating transistors x1-xm could be made as P-channel transistors and all of the lower gating transistors y1-ym could be made as N-channel transistors, and vice versa.

From the foregoing detailed description, it can thus be seen that the present invention provides a CMOS gate having a programmable driving power characteristic so that its propagation delay time can be varied by digitally selected control signals The CMOS gate includes a programmable inverter circuit section formed of a plurality of inverters, a switching logic control section, and a static inverter. The switching logic control section is responsive to the digital select control signals for selectively programming a certain number of the plurality of inverters to be enabled. As a result, the certain number of the plurality of inverters will be wired in parallel with the static inverter in order to establish the desired amount of propagation delay time.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A CMOS gate having a programmable driving power characteristic, comprising:

a plurality of parallel-connected inverters (12a-12m) having their inputs connected to an input node for receiving an input logic signal and their outputs connected to an output node for generating an output logic signal, each of said plurality of inverters being formed of P-channel transistor (p1-pm) and an N-channel transistor (n1-nm);

a plurality of upper switching transistors (x1-xm) having their conduction paths connected between a power supply potential (VCC) and a respective source electrode of said P-channel transistors of said plurality of inverters;

a plurality of lower switching transistors (y1-ym) having their conduction paths connected between a ground potential and a respective source electrode of said N-channel transistors of said plurality of inverters;

the gate electrodes of said plurality of lower switching transistors being connected to a corresponding one of the gate electrodes of said plurality of upper switching transistors and to receive a corresponding one of digital select control signals (S1-Sm);

each of said digital select control signals being either at a high or low logic level for selectively programming certain ones of said upper and lower switching transistors to be turned on so as to enable selected ones of said plurality of inverters for varying the driving power characteristic; and said output logic signal having a propagation delay relative to said input logic signal which is dependent upon the driving power characteristic.

2. A CMOS gate as claimed in claim 1, wherein said driving power characteristic is increased as the number of enabled inverters is increased so as to reduce the propagation delay between the output logic signal and the input logic signal.

3. A CMOS gate as claimed in claim 1, further comprising a static inverter (16) formed of a P-channel transistor (px) and an N-channel transistor (ny) whose gate electrodes are connected together and to the input node and whose drain electrodes are connected together and to the output node, the source electrode of said P-channel transistor being connected to the power supply potential and the source electrode of said N-channel transistor being connected to the ground potential.

4. A CMOS gate as claimed in claim 3, wherein said driving power characteristic is determined by said static inverter when all of said digital select control signals are at the low logic level.

5. A CMOS gate as claimed in claim 1, wherein said plurality of upper and lower switching transistors are N-channel MOS transistors.

6. A CMOS gate as claimed in claim 1, wherein said plurality of upper and lower switching transistors are P-channel MOS transistors.

7. A CMOS gate as claimed in claim 1, wherein said plurality of upper switching transistors are P-channel MOS transistors, and wherein said plurality of lower switching transistors are N-channel MOS transistors.

8. A CMOS gate as claimed in claim 1, wherein said plurality of upper switching transistors are N-channel MOS transistors, and wherein said plurality of lower switching transistors are P-channel MOS transistors.

9. A CMOS gate having a programmable driving power characteristic, comprising:

programmable inverter circuit means (12) having an input connected to an input node for receiving an input logic signal and an output connected to an output node for generating an output logic signal, said programmable inverter circuit means being formed of a plurality of parallel-connected inverters (12a-12m), each of said plurality of inverters being formed of a P-channel transistor (p1-pm) and an N-channel transistor (n1-nm);

switching means (14) responsive to digital select control signals (S1-Sm) for selectively programming certain ones of said plurality of inverters to be enabled for varying the driving power characteristic;

said driving power characteristic being increased as the number of enabled inverters is increased so as to reduce the propagation delay of the output logic signal relative to the input logic signal;

a static inverter (16) being formed of a P-channel transistor (px) and an N-channel transistor (ny) whose gate electrodes are connected together and to the input node and whose drain electrodes are connected together and to the output node, the source electrode of said P-channel transistor being connected to the power supply potential and the source electrode of said N-channel transistor being connected to the ground potential;

said driving power characteristic being solely determined by said static inverter when all of said digital select control signals are at the low logic level; and said switching means including a plurality of upper switching transistors (x1-xm) having their conduction paths connected between a power supply potential (VCC) and a respective source electrode of said P-channel transistors of said plurality of inverters.

10. A CMOS gate as claimed in claim 9, wherein said switching means further includes a plurality of lower switching transistors (y1-ym) having their conduction paths connected between a ground potential and a respective source electrode of said N-channel transistors of said plurality of inverters.

11. A CMOS gate as claimed in claim 10, wherein said plurality of upper and lower switching transistors are N-channel MOS transistors.

12. A CMOS gate as claimed in claim 10, wherein said plurality of upper and lower switching transistors are P-channel MOS transistors.

13. A CMOS gate as claimed in claim 10, wherein said plurality of upper switching transistors are P-channel MOS transistors, and wherein said plurality of lower switching transistors are N-channel MOS transistors.

14. A CMOS gate as claimed in claim 10, wherein said plurality of upper switching transistors are N-channel MOS transistors, and wherein said plurality of lower switching transistors are P-channel MOS transistors.

* * * * *